US012628703B2

(12) United States Patent　　　　　　(10) Patent No.:　US 12,628,703 B2

Hsu et al.　　　　　　　　　　　　　　(45) Date of Patent:　May 12, 2026

(54) DISPLAY APPARATUS AND MANUFACTURING METHOD THEREOF

(71) Applicant: AUO Corporation, Hsinchu (TW)

(72) Inventors: Wan-Ting Hsu, Hsinchu (TW); Chun-Liang Lin, Hsinchu (TW)

(73) Assignee: AUO Corporation, Hsinchu (TW)

( * ) Notice: Subject to any disclaimer, the term of this patent is extended or adjusted under 35 U.S.C. 154(b) by 386 days.

(21) Appl. No.: 18/544,462

(22) Filed: Dec. 19, 2023

(65) Prior Publication Data

US 2024/0413140 A1　　Dec. 12, 2024

(30) Foreign Application Priority Data

Jun. 9, 2023　(TW) ................................. 112121733

(51) Int. Cl.

| | |
|---|---|
| *H10W 90/00* | (2026.01) |
| *H10H 20/855* | (2025.01) |
| *H10H 29/85* | (2025.01) |
| *H10K 59/122* | (2023.01) |
| *H10K 59/38* | (2023.01) |
| *H10K 59/95* | (2026.01) |

(52) U.S. Cl.

CPC .................................. *H10W 90/00* (2026.01)

(58) Field of Classification Search

CPC .. H10H 20/855; H10H 20/0361; H10H 29/85; H10H 29/8508–8512; H10W 90/00; H10K 59/122; H10K 59/38; H10K 59/8792; H10K 59/8791; H10K 59/855; H10K 59/1201; H10K 59/95

See application file for complete search history.

(56) References Cited

U.S. PATENT DOCUMENTS

| | | | | |
|---|---|---|---|---|
| 11,515,456 | B2 * | 11/2022 | Chen ...................... | H10H 20/84 |
| 2022/0077121 | A1 * | 3/2022 | Bae ...................... | H10W 90/00 |
| 2022/0123183 | A1 * | 4/2022 | Kim ..................... | H10H 20/855 |
| 2023/0005996 | A1 * | 1/2023 | Lee ...................... | H10K 59/873 |
| 2023/0006112 | A1 * | 1/2023 | Kim ..................... | H10W 90/00 |
| 2023/0029779 | A1 * | 2/2023 | Kwak .................. | H10K 59/353 |
| 2024/0297275 | A1 * | 9/2024 | Koh ................... | H10H 20/8512 |

FOREIGN PATENT DOCUMENTS

| | | |
|---|---|---|
| CN | 107507845 | 12/2017 |
| CN | 111599908 | 10/2021 |
| TW | 202331365 | 8/2023 |

* cited by examiner

*Primary Examiner* — Omar F Mojaddedi

(74) *Attorney, Agent, or Firm* — JCIPRNET

(57)　　　　　ABSTRACT

A display apparatus includes a color filter substrate, a first encapsulation layer, a first bank layer, color conversion patterns, a second encapsulation layer, a second bank layer, a driving circuit substrate, and light-emitting devices. The first encapsulation layer is disposed on the color filter substrate. The first bank layer is disposed on the first encapsulation layer. The color conversion patterns are disposed in first openings of the first bank layer. The second encapsulation layer is disposed on the first bank layer and the color conversion patterns. The second bank layer is disposed on the second encapsulation layer. The driving circuit substrate is disposed opposite to the color filter substrate. The light-emitting devices are disposed on and electrically connected to the driving circuit substrate. The driving circuit substrate and the second bank layer are spaced from each other by a distance in a direction perpendicular to the driving circuit substrate.

16 Claims, 7 Drawing Sheets

CF {
110
120
130R
130G
130B 180
162
160
140
120
110

170B  130B    170G  130G    170R  130R
122

CF {
110
120
130R
130G
130B 192
190
180
162
160
140
120
110

170B  130B    170G  130G    170R  130R  122

1

220B     220G     220R

210

2

DISPLAY APPARATUS AND MANUFACTURING METHOD THEREOF

CROSS-REFERENCE TO RELATED APPLICATION

This application claims the priority benefit of Taiwan application serial no. 112121733, filed on Jun. 9, 2023. The entirety of the above-mentioned patent application is hereby incorporated by reference herein and made a part of this specification.

BACKGROUND

Technical Field

The disclosure relates to a photoelectric device and a manufacturing method thereof, and particularly to a display apparatus and a manufacturing method thereof.

Description of Related Art

Flat panel display apparatuses are favored for their light-weight, compact size, and reduced volume and therefore have been widely used in daily lives. The flat panel display apparatus includes a driving circuit substrate, a plurality of light-emitting devices electrically connected to the driving circuit substrate, and a color filter substrate positioned opposite to the driving circuit substrate. The color filter substrate includes a light-blocking pattern layer and a plurality of color filter patterns. The light-blocking pattern layer has a plurality of sub-pixel openings overlapped with the light-emitting devices, and the color filter patterns are disposed in the sub-pixel openings. The flat panel display apparatus may further include a plurality of color conversion patterns overlapped with the light-emitting devices, thus enhancing color saturation. To mitigate issues of mixed light, the flat panel display apparatus is further equipped with a first bank layer separating the color conversion patterns and a second bank layer separating the light-emitting devices. However, due to an excessive distance between the first bank layer and the second bank layer in a direction perpendicular to the driving circuit substrate, light beams emitted by the light-emitting devices in different sub-pixel regions enter adjacent sub-pixels, which leads to dull defects in the adjacent sub-pixels adverse impact on an optical performance of the flat panel display apparatus.

SUMMARY

The disclosure provides a display apparatus with a favorable optical performance.

An embodiment of the disclosure provides a manufacturing method of a display apparatus, and the manufacturing method includes following steps. A color filter substrate is provided. A first encapsulation layer is formed on the color filter substrate. A first bank layer is formed on the first encapsulation layer, where the first bank layer has a plurality of first openings. A plurality of color conversion patterns are formed in the first openings of the first bank layer, respectively. A second encapsulation layer is formed on the first bank layer and the color conversion patterns. A second bank layer is formed on the second encapsulation layer, where the second bank layer has a plurality of second openings, the first openings of the first bank layer and the second openings of the second bank layer are respectively overlapped, and the color filter substrate, the first encapsulation layer, the first bank layer, the color conversion patterns, the second encapsulation layer, and the second bank layer form a color conversion substrate. A plurality of light-emitting devices are formed on a driving circuit substrate, and the light-emitting devices are electrically connected to the driving circuit substrate, where the driving circuit substrate and the light-emitting devices form a light-emitting device array substrate. The color conversion substrate and the light-emitting device array substrate are assembled to secure the color conversion substrate and the light-emitting device array substrate to each other, where the light-emitting devices and the second openings of the second bank layer of the color conversion substrate are respectively overlapped, and the driving circuit substrate and the second bank layer are spaced from each other by distance in a direction perpendicular to the driving circuit substrate.

An embodiment of the disclosure provides a display apparatus which includes a color filter substrate, a first encapsulation layer, a first bank layer, a plurality of color conversion patterns, a second encapsulation layer, a second bank layer, a driving circuit substrate, and a plurality of light-emitting devices. The first encapsulation layer is disposed on the color filter substrate. The first bank layer is disposed on the first encapsulation layer and has a plurality of first openings. The color conversion patterns are respectively disposed in the first openings of the first bank layer. The second encapsulation layer is disposed on the first bank layer and the color conversion patterns. The second bank layer is disposed on the second encapsulation layer and has a plurality of second openings, where the first openings of the first bank layer and the second openings of the second bank layer are respectively overlapped. The driving circuit substrate is disposed opposite to the color filter substrate. The light-emitting devices are disposed on the driving circuit substrate, electrically connected to the driving circuit substrate, and respectively overlapped with the second openings of the second bank layer. The driving circuit substrate and the second bank layer are spaced from each other by a distance in a direction perpendicular to the driving circuit substrate.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
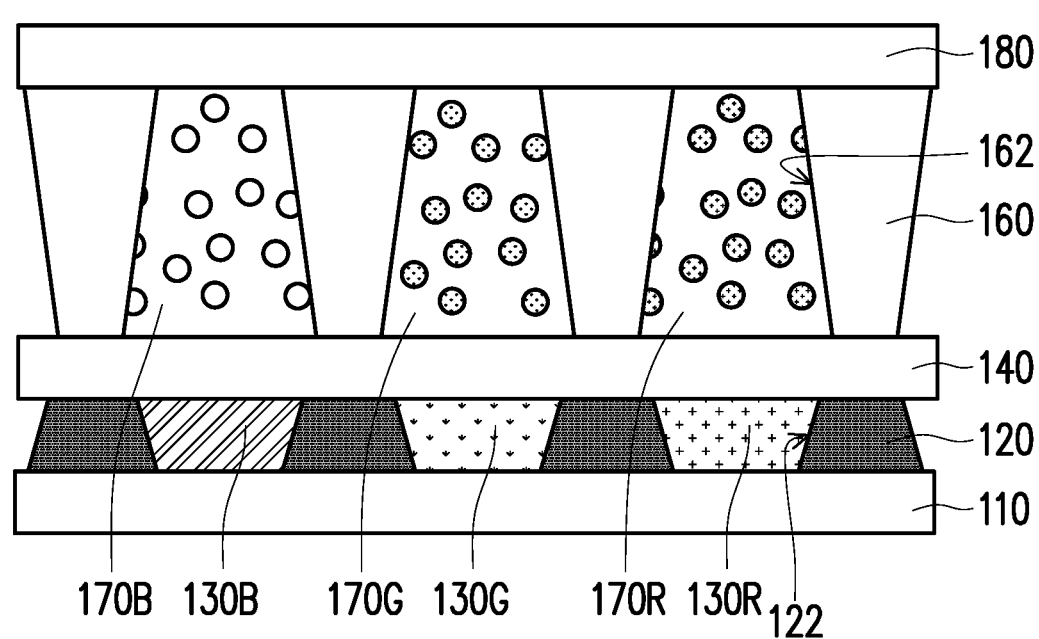
FIG. 1A to FIG. 1F are schematic cross-sectional diagrams of a manufacturing process of a display apparatus according to a first embodiment of the disclosure.

Reference will now be made in detail to the exemplary embodiments of the disclosure, examples of which are illustrated in the accompanying drawings. Whenever possible, the same reference numbers are used in the drawings and the description to refer to the same or like parts.

It should be understood that when a device, such as a layer, a film, a region, or a substrate is referred to as being "on" or "connected to" another element, it can be directly on or connected to the another device, or an intermediate device may also be present. By contrast, when a device is referred to as being "directly on" or "directly connected to" another device, no intermediate device is present. As used herein, being "connected" may refer to a physical and/or electrical connection. Furthermore, being "electrically connected" or "coupled" may refer to the presence of other devices between the two devices.

Considering the particular amount of measurement and measurement-related errors discussed (i.e., the limitations of the measurement system), the terminology "about," "approximately," or "substantially" used herein includes the average of the stated value and an acceptable range of deviations from the particular value as determined by those skilled in the art. For instance, the terminology "about" may refer to as being within one or more standard deviations of the stated value, or within ±30%, ±20%, ±10%, or ±5%. Furthermore, the terminology "about," "approximately," or "substantially" as used herein may be chosen from a range of acceptable deviations or standard deviations depending on the optical properties, etching properties, or other properties, rather than one standard deviation for all properties.

Unless otherwise defined, all terminologies (including technical and scientific terminologies) used herein have the same meaning as commonly understood by people having ordinary skill in the art to which the disclosure belongs. It is understood that these terminologies, such as those defined in commonly used dictionaries, should be interpreted as having meanings consistent with the relevant art and the background or context of the disclosure, and should not be interpreted in an idealized or overly formal way, unless otherwise defined in the disclosure.

FIG. 1A to FIG. 1F are schematic cross-sectional diagrams of a manufacturing process of a display apparatus according to a first embodiment of the disclosure.

With reference to FIG. 1A, a color filter substrate CF is provided. Specifically, in an embodiment, a light-shielding pattern layer 120 may be formed on a substrate 110, where the light-shielding pattern layer 120 has a plurality of sub-pixel openings 122. A plurality of color filter patterns 130R, 130G, and 130B are then respectively formed in the sub-pixel openings 122 of the light-shielding pattern layer 120, so as to form the color filter substrate CF.

The color filter substrate CF includes the substrate 110, the light-shielding pattern layer 120 disposed on the substrate 110, and the color filter patterns 130R, 130G, and 130B respectively disposed in the sub-pixel openings 122 of the light-shielding pattern layer 120. In an embodiment, the substrate 110 may be a transparent substrate, and a material of the transparent substrate may include glass, quartz, an organic polymer, or any other applicable material. The light-shielding pattern layer 120 may be a black matrix, and a material of the black matrix may be black resin or any other applicable material. The color filter patterns 130R, 130G, and 130B have different colors and may include a red filter pattern 130R, a green filter pattern 130G, and a blue filter pattern 130B, which should however not be construed as a limitation in the disclosure.

As shown in FIG. 1A, a first encapsulation layer 140 is formed on the color filter substrate CF. In an embodiment, the first encapsulation layer 140 may cover the color filter substrate CF entirely, which should however not be construed as a limitation in the disclosure. In an embodiment, a material of the first encapsulation layer 140 may include a transparent inorganic material (e.g., silicon oxide, silicon nitride, silicon oxynitride, or a stacked layer having at least two of the above materials), a transparent organic material, or a combination of the above, which should however not be construed as a limitation in the disclosure.

As shown in FIG. 1A, a first bank layer 160 is formed on the first encapsulation layer 140. The first bank layer 160 has a plurality of first openings 162. The first openings 162 of the first bank layer 160 and the color filter patterns 130R, 130G, and 130B of the color filter substrate CF are respectively overlapped. In an embodiment, a material of the first bank layer 160 may absorb and/or reflect light, which should however not be construed as a limitation in the disclosure. In an embodiment, a color of the first bank layer 160 may optionally be white, which should however not be construed as a limitation in the disclosure, and the color of the first bank layer 160 may also be black, gray, and so on, for instance.

As shown in FIG. 1A, a plurality of color conversion patterns 170R, 170B, and 170G are respectively formed in the first openings 162 of the first bank layer 160. The color conversion patterns 170R, 170B, and 170G may have a photoluminescence (PL) material with a single-layer structure or a multi-layer structure. The PL material may include a phosphor material, a quantum dot (QD) material, a perovskite material, or any other appropriate PL material. For instance, in an embodiment, the color conversion pattern 170R may include the QD material for generating a red light wavelength, the color conversion pattern 170G may include the QD material for generating a green light wavelength, the color conversion pattern 170B may include a transparent photoresist or a transparent planarization layer, and the color conversion pattern 170B may not be doped with any QD material, which should however not be construed as a limitation in the disclosure. In an embodiment, when an incident light (not shown) is a blue light, the color conversion pattern 170R may convert a wavelength of the blue light to a wavelength of a red light, the color conversion pattern 170G may convert the wavelength of the blue light to a wavelength of a green light, the color conversion pattern 170B may allow the incident light to directly penetrate, and a resultant emitted light passing through the color conversion patterns 170R, 170G, and 170B may be the red light, the green light, and the blue light, respectively. In another embodiment, if the color conversion pattern 170B includes a blue QD material (not indicated), then the incident light may be an ultraviolet light, and the rest of the color conversion patterns 170R and 170G may also convert a wavelength of the ultraviolet light to a wavelength of the corresponding color (e.g., red or green) light.

As shown in FIG. 1A, a second encapsulation layer 180 is formed on the first bank layer 160 and the color conversion patterns 170R, 170B, and 170G. In an embodiment, the second encapsulation layer 180 may entirely cover the first bank layer 160 and the color conversion patterns 170R, 170B, and 170G, which should however not be construed as a limitation in the disclosure. In an embodiment, a material of the second encapsulation layer 180 may include a transparent inorganic material (e.g., silicon oxide, silicon nitride, silicon oxynitride, or a stacked layer having at least two of the above-mentioned materials), a transparent organic material, or a combination of the above, which should however not be construed as a limitation in the disclosure.

Figure 1B:
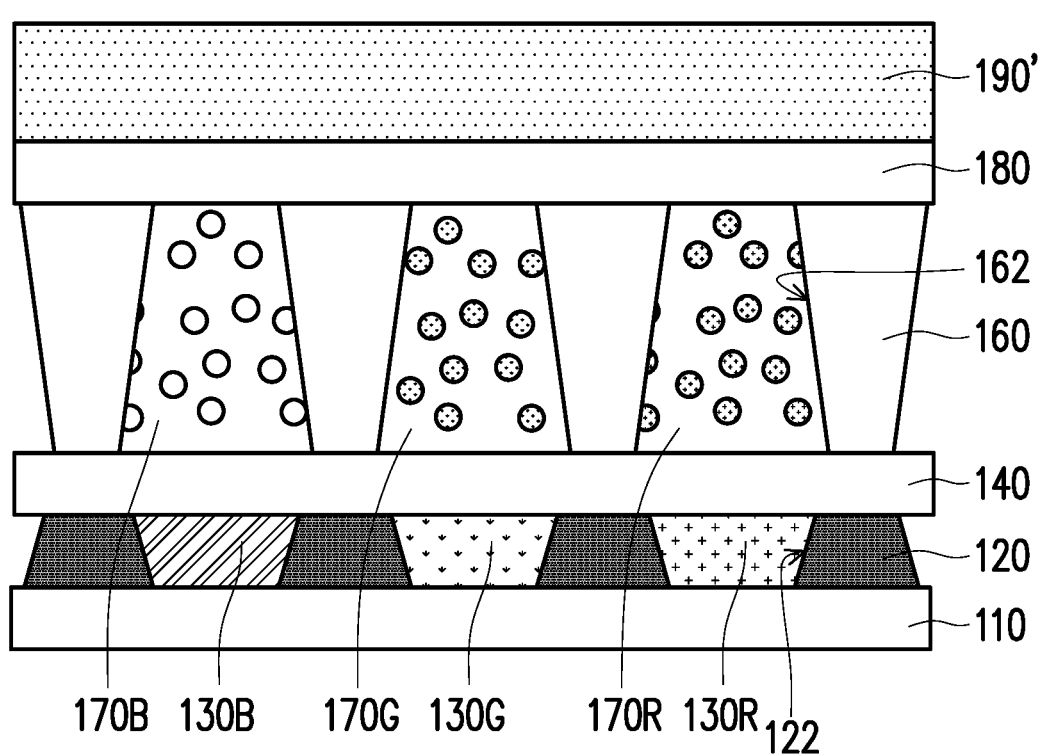
Figure 1C:
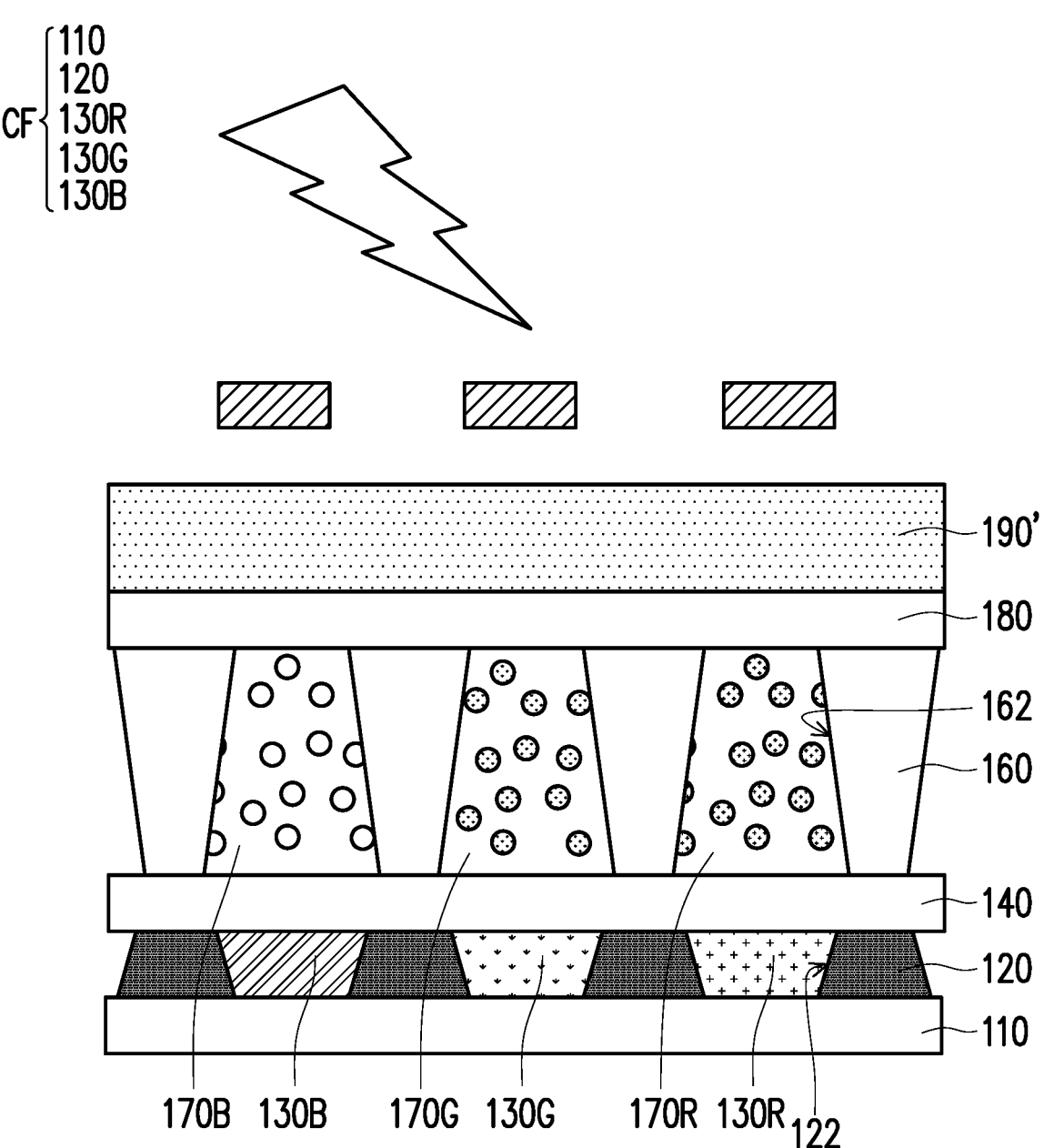
Figure 1D:
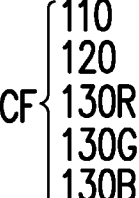
Figure 1D:
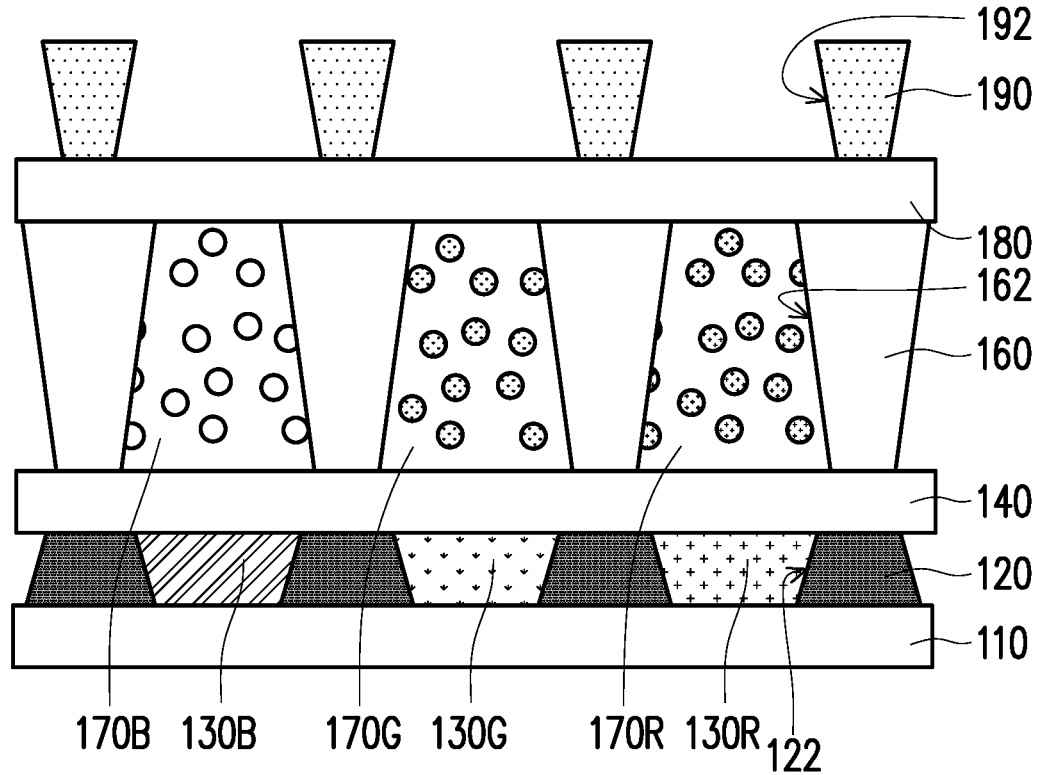

With reference to FIG. 1B, FIG. 1C, and FIG. 1D, a second bank layer 190 is formed on the second encapsulation layer 180, where the second bank layer 190 has a plurality of second openings 192, and the first openings 162 of the first bank layer 160 and the second openings 192 of the second bank layer 190 are respectively overlapped. The color filter substrate CF, the first encapsulation layer 140, the first bank layer 160, the color conversion patterns 170R, 170G, and 170B, the second encapsulation layer 180, and the second bank layer 190 form a color conversion substrate 1.

For instance, in an embodiment, a second bank material layer 190' may be formed on the second encapsulation layer 180 by applying a spin coating method, where a material of the second bank material layer 190' is a photoresist. An exposure and development process is then performed on the second bank material layer 190' to form the second bank layer 190 having the second openings 192. However, this should not be construed as a limitation in the disclosure, and in other embodiments, the second bank layer 190 may also be formed by applying another process or may be made of another material. In an embodiment, a color of the second bank layer 190 is, for instance, black. However, this should not be construed as a limitation in the disclosure, and in other embodiments, the color of the second bank layer 190 may also be another color, e.g., white, gray, and so on.

Figure 1E:
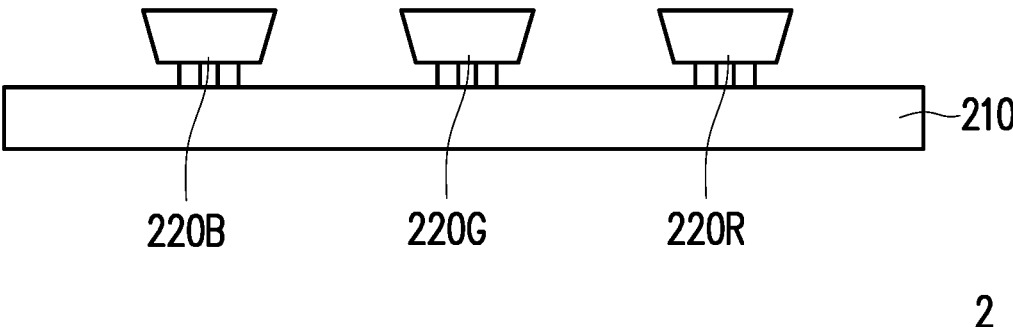

With reference to FIG. 1E, a plurality of light-emitting devices 220R, 220G, and 220B are formed on the driving circuit substrate 210, and the light-emitting devices 220R, 220G, and 220B are electrically connected to the driving circuit substrate 210. The driving circuit substrate 210 and the light-emitting devices 220R, 220G, and 220B form a light-emitting device array substrate 2.

For instance, in an embodiment, the driving circuit substrate 210 having a plurality of sub-pixel driving structures (not shown) may be formed first, the light-emitting devices 220R, 220G, and 220B are then transferred onto the driving circuit substrate 210, and the light-emitting devices 220R, 220G, and 220B are electrically connected to the sub-pixel driving structures, respectively.

In an embodiment, each of the sub-pixel driving structures may include a sub-pixel driving circuit (not shown) and a pad group (not shown) that are electrically connected to each other. In an embodiment, the sub-pixel driving circuit may include a first transistor (not shown), a second transistor (not shown), and a capacitor (not shown), where a first terminal of the first transistor is electrically connected to a corresponding data line (not shown), a control terminal of the first transistor is electrically connected to a corresponding scan line (not shown), a second terminal of the first transistor is electrically connected to a control terminal of the second transistor, a first terminal of the second transistor is electrically connected to a corresponding power line (not shown), the capacitor is electrically connected to the second terminal of the first transistor and the first terminal of the second transistor, the second terminal of the second transistor is electrically connected to a pad of the pad group, another pad of the pad group is electrically connected to a corresponding common line (not shown), each of the light-emitting devices 220R, 220G, and 220B may be a micro light-emitting diode (μLED) having a plurality of electrodes (not shown), and the electrodes of each of the light-emitting devices 220R, 220G, and 220B are electrically connected to a plurality of pads of a corresponding pad group. However, this should not be construed as a limitation in the disclosure, and in other embodiments, the sub-pixel driving structures and/or the light-emitting devices 220R, 220G, and 220B may also be in other forms.

Figure 1F:
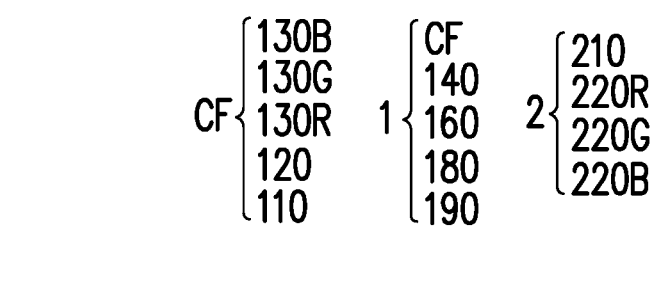
Figure 1F:
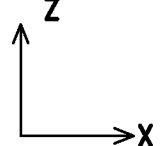
Figure 1F:
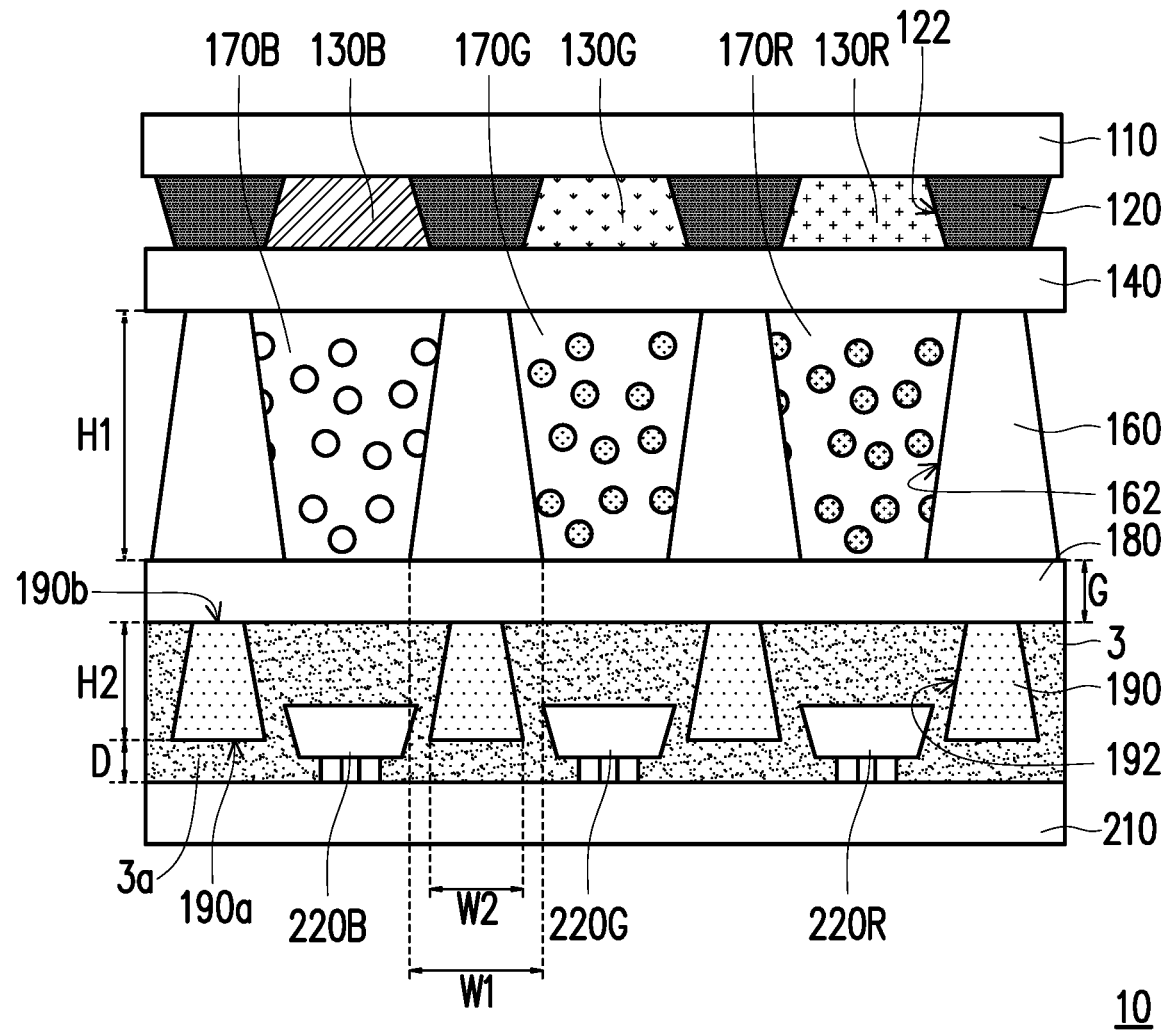

With reference to FIG. 1D, FIG. 1E, and FIG. 1F, the color conversion substrate 1 and the light-emitting device array substrate 2 are then assembled, so that the color conversion substrate 1 and the light-emitting device array substrate 2 are secured to each other, thereby forming a display apparatus 10. Particularly, in an embodiment, an adhesion layer 3 may be formed on either the color conversion substrate 1 or the light-emitting device array substrate 2, and the color conversion substrate 1 and the light-emitting device array substrate 2 are assembled, so that the color conversion substrate 1 and the light-emitting device array substrate 2 are secured to each other by the adhesion layer 3.

With reference to FIG. 1F, a display apparatus 10 includes the color filter substrate CF, the first encapsulation layer 140, the first bank layer 160, the color conversion patterns 170R, 170G, and 170B, the second encapsulation layer 180, the second bank layer 190, the driving circuit substrate 210, and the light-emitting devices 220R, 220G, and 220B. The first encapsulation layer 140 is disposed on the color filter substrate CF. The first bank layer 160 is disposed on the first encapsulation layer 140 and has the first openings 162. The color conversion patterns 170R, 170G, and 170B are respectively disposed in the first openings 162 of the first bank layer 160. The second encapsulation layer 180 is disposed on the first bank layer 160 and the color conversion patterns 170R, 170G, and 170B. The second bank layer 190 is disposed on the second encapsulation layer 180 and has the second openings 192. The first openings 162 of the first bank layer 160 and the second openings 192 of the second bank layer 190 are respectively overlapped. The driving circuit substrate 210 is disposed opposite to the color filter substrate CF. The light-emitting devices 220R, 220G, and 220B are disposed on the driving circuit substrate 210, electrically connected to the driving circuit substrate 210, and respectively overlapped with the second openings 192 of the second bank layer 190.

Particularly, the driving circuit substrate 210 and the second bank layer 190 are spaced from each other by a distance D in a direction z perpendicular to the driving circuit substrate 210. To be specific, in an embodiment, the second bank layer 190 has a first surface 190a facing the driving circuit substrate 210, and the first surface 190a of the second bank layer 190 is spaced from the driving circuit substrate 210 by the distance D in the direction z perpendicular to the driving circuit substrate 210. For instance, in an embodiment, the distance D may be less than 2 μm, which should however not be construed as a limitation in the disclosure.

The display apparatus 10 further includes the adhesion layer 3 that is disposed between the color conversion substrate 1 and the light-emitting device array substrate 2. The second bank layer 190 has the first surface 190a facing the driving circuit substrate 210, and a portion 3a of the adhesion layer 3 is disposed between the first surface 190a of the second bank layer 190 and the driving circuit substrate 210. In an embodiment, the portion 3a of the adhesion layer 3 may directly contact the first surface 190a of the second bank layer 190 facing the driving circuit substrate 210. In an embodiment, the second bank layer 190 further has a second surface 190b opposite to the first surface 190a, and the second surface 190b of the second bank layer 190 directly contacts the second encapsulation layer 180.

In an embodiment, the first bank layer 160 and the second bank layer 190 respectively have a first height H1 and a second height H2 in the direction z perpendicular to the driving circuit substrate 210, and the second height H2 is less than or equal to the first height H1. In an embodiment, the first bank layer 160 and the second bank layer 190 respectively have a first width W1 and a second width W2 in the direction z parallel to the driving circuit substrate 210, and the second width W2 is less than or equal to the first width W1.

Note that the second encapsulation layer 180 covers the first bank layer 160 and the color conversion patterns 170R, 170G, and 170B, and the second bank layer 190 is formed on the second encapsulation layer 180, thereby completing the fabrication of the color conversion substrate 1. Therefore, when the color conversion substrate 1 and the light-emitting device array substrate 2 are assembled to complete the fabrication of the display apparatus 10, a distance G between the first bank layer 160 and the second bank layer of the display apparatus 10 provided in the first embodiment as illustrated in FIG. 1F, which will not be repeated here-inafter.

With simulated distances G between the first bank layer 160 and the second bank layer 190, Table 1 below lists light-emitting intensity ratios of the display apparatuses 10 and 10A in various embodiments, given that the light beams emitted by the light-emitting devices enter the adjacent sub-pixels and thus cause dull defects in the adjacent sub-pixels. From the simulation data in Table 1, it may be learned that the optimal distance G between the first bank layer 160 and the second bank layer 190 is less than 2 μm.

TABLE 1

| | Color of the first bank layer 160/160A | Distance G between the first bank layer 160/160A and the second bank layer 190 (μm) | Weight percentage of scattering particles of titanium dioxide in the adhesion layer 3 (%) | Weight percentage of scattering particles of titanium dioxide in the color filter pattern 170B (%) | Light-emitting intensity of R and B pixels/light-emitting intensity of G pixels |
|---|---|---|---|---|---|
| Display apparatus 10A provided in the second embodiment | black | 0 | 6 | 5 | 0.4% |
| | black | 2 | 6 | 5 | 0.7% |
| | black | 4 | 6 | 5 | 1.0% |
| Display apparatus 10 provided in the first embodiment | white | 0 | 6 | 5 | 1.3% |
| | white | 2 | 6 | 5 | 1.6% |
| | white | 4 | 6 | 5 | 2.0% |

190 in the display apparatus 10 is substantially equal to a thickness of the second encapsulation layer 180 rather than the sum of the thickness of the second bank layer 190 and a portion of the adhesion layer 3. As such, the distance G between the first bank layer 160 and the second bank layer 190 may be reduced, thus mitigating cross-talks between a plurality of light beams emitted by the light-emitting devices 220R, 220G, and 220B located in different sub-pixel regions. Accordingly, the optical performance of the display apparatus 10 is improved, and the issue of dull defects in the neighboring sub-pixels, which arises from the fact that the light beams emitted by the light-emitting devices enter the neighboring sub-pixels, may be mitigated.

It should be noted that reference numbers of the devices and a part of contents of the previous embodiments are also used in the following embodiments, where the same reference numbers denote the same or like devices, and descriptions of the same technical contents are omitted. The previous embodiments may be referred for descriptions of the omitted parts, and detailed descriptions thereof are not repeated in the following embodiments.

Figure 2:
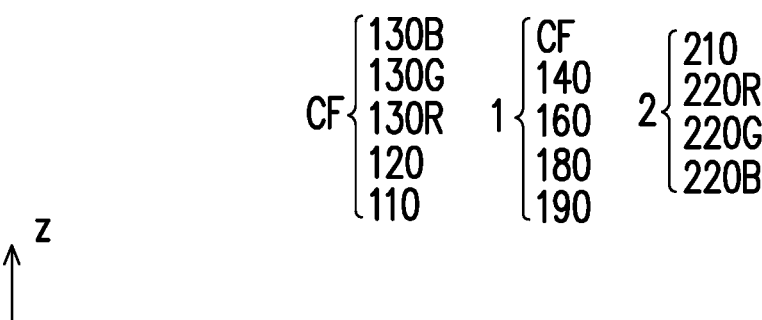
FIG. 2 is a schematic cross-sectional diagram of a display apparatus according to a second embodiment of the disclosure.

FIG. 2 is a schematic cross-sectional diagram of a display apparatus according to a second embodiment of the disclosure. A display apparatus 10A provided in the second embodiment as illustrated in FIG. 2 is similar to the display apparatus 10 provided in the first embodiment as illustrated in FIG. 1F, while one of the differences therebetween lies in that the colors of the first bank layers 160 and 160A of the two display apparatuses 10 and 10A are different. Specifically, the color of the first bank layer 160 provided in the first embodiment as illustrated in FIG. 1F is white, while the color of the first bank layer 160A provided in the second embodiment as illustrated in FIG. 2 is black. The display apparatus 10A provided in the second embodiment as illustrated in FIG. 2 has similar effects and advantages to those It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a display apparatus, comprising:

providing a color filter substrate;

forming a first encapsulation layer on the color filter substrate;

forming a first bank layer on the first encapsulation layer, wherein the first bank layer has a plurality of first openings;

forming a plurality of color conversion patterns in the first openings of the first bank layer, respectively;

forming a second encapsulation layer on the first bank layer and the color conversion patterns;

forming a second bank layer on the second encapsulation layer, wherein the second bank layer has a plurality of second openings, the first openings of the first bank layer and the second openings of the second bank layer are respectively overlapped, and the color filter substrate, the first encapsulation layer, the first bank layer, the color conversion patterns, the second encapsulation layer, and the second bank layer form a color conversion substrate;

forming a plurality of light-emitting devices on a driving circuit substrate, and electrically connecting the light-emitting devices to the driving circuit substrate, wherein the driving circuit substrate and the light-emitting devices form a light-emitting device array substrate; and assembling the color conversion substrate and the light-emitting device array substrate to secure the color conversion substrate and the light-emitting device array substrate to each other, wherein the light-emitting devices and the second openings of the second bank layer of the color conversion substrate are respectively overlapped, and the driving circuit substrate and the second bank layer are spaced from each other by distance in a direction perpendicular to the driving circuit substrate.

2. The manufacturing method of the display apparatus as claimed in claim 1, wherein the second bank layer has a first surface facing the driving circuit substrate, and the first surface of the second bank layer and the driving circuit substrate are spaced from each other by the distance in the direction perpendicular to the driving circuit substrate.

3. The manufacturing method of the display apparatus as claimed in claim 1, wherein an adhesion layer is disposed between the color conversion substrate and the light-emitting device array substrate, the second bank layer has a first surface facing the driving circuit substrate, and a portion of the adhesion layer is disposed between the first surface of the second bank layer and the driving circuit substrate.

4. The manufacturing method of the display apparatus as claimed in claim 3, wherein the portion of the adhesion layer directly contacts the first surface of the second bank layer facing the driving circuit substrate.

5. The manufacturing method of the display apparatus as claimed in claim 3, wherein the second bank layer further has a second surface opposite to the first surface, and the second surface of the second bank layer directly contacts the second encapsulation layer.

6. The manufacturing method of the display apparatus as claimed in claim 1, wherein the first bank layer and the second bank layer respectively have a first height and a second height in the direction perpendicular to the driving circuit substrate, and the second height is less than or equal to the first height.

7. The manufacturing method of the display apparatus as claimed in claim 1, wherein the first bank layer and the second bank layer respectively have a first width and a second width in a direction parallel to the driving circuit substrate, and the second width is less than or equal to the first width.

8. The manufacturing method of the display apparatus as claimed in claim 1, wherein the distance is less than 2 μm.

9. A display apparatus, comprising:
a color filter substrate;
a first encapsulation layer, disposed on the color filter substrate;
a first bank layer, disposed on the first encapsulation layer and having a plurality of first openings;
a plurality of color conversion patterns, respectively disposed in the first openings of the first bank layer;

a second encapsulation layer, disposed on the first bank layer and the color conversion patterns;
a second bank layer, disposed on the second encapsulation layer and having a plurality of second openings, wherein the first openings of the first bank layer and the second openings of the second bank layer are respectively overlapped;
a driving circuit substrate, disposed opposite to the color filter substrate; and
a plurality of light-emitting devices, disposed directly on the driving circuit substrate, electrically connected to the driving circuit substrate, and respectively overlapped with the second openings of the second bank layer,
the plurality of light-emitting devices are disposed in between the driving circuit substrate and the second bank layer,
wherein the driving circuit substrate and the second bank layer are spaced from each other by a distance in a direction perpendicular to the driving circuit substrate.

10. The display apparatus as claimed in claim 9, wherein the second bank layer has a first surface facing the driving circuit substrate, and the first surface of the second bank layer and the driving circuit substrate are spaced from each other by the distance in the direction perpendicular to the driving circuit substrate.

11. The display apparatus as claimed in claim 9, further comprising:
an adhesion layer, wherein the second bank layer has a first surface facing the driving circuit substrate, and a portion of the adhesion layer is disposed between the first surface of the second bank layer and the driving circuit substrate.

12. The display apparatus as claimed in claim 11, wherein the portion of the adhesion layer directly contacts the first surface of the second bank layer facing the driving circuit substrate.

13. The display apparatus as claimed in claim 11, wherein the second bank layer further has a second surface opposite to the first surface, and the second surface of the second bank layer directly contacts the second encapsulation layer.

14. The display apparatus as claimed in claim 9, wherein the first bank layer and the second bank layer respectively have a first height and a second height in the direction perpendicular to the driving circuit substrate, and the second height is less than or equal to the first height.

15. The display apparatus as claimed in claim 9, wherein the first bank layer and the second bank layer respectively have a first width and a second width in a direction parallel to the driving circuit substrate, and the second width is less than or equal to the first width.

16. The display apparatus as claimed in claim 9, wherein the distance is less than 2 μm.

* * * * *